US008729979B2

(12) United States Patent
Kojima et al.

(10) Patent No.: US 8,729,979 B2

(45) Date of Patent: May 20, 2014

(54) INPUT/OUTPUT COUPLING STRUCTURE FOR DIELECTRIC WAVEGUIDE

(75) Inventors: Hiroshi Kojima, Tsurugashima (JP); Takayuki Yabe, Tsurugashima (JP); Kazuhiro Ito, Tsurugashima (JP)

(73) Assignee: Toko, Inc., Tsurugashima (JP)

( * ) Notice: Subject to any disclaimer, the term of this patent is extended or adjusted under 35 U.S.C. 154(b) by 52 days.

(21) Appl. No.: 13/350,562

(22) Filed: Jan. 13, 2012

(65) Prior Publication Data

US 2012/0206213 A1 Aug. 16, 2012

(30) Foreign Application Priority Data

Jan. 13, 2011 (JP) ................................ 2011-004603

(51) Int. Cl.
*H03H 5/00* (2006.01)
*H01P 1/00* (2006.01)

(52) U.S. Cl.
USPC .............................. 333/26; 333/248; 333/254

(58) Field of Classification Search
USPC ........................................................... 333/26
See application file for complete search history.

(56) References Cited

U.S. PATENT DOCUMENTS 4,716,387 A * 12/1987 Igarashi .......................... 333/26
4,725,798 A * 2/1988 Igarashi ........................ 333/212
7,132,905 B2 * 11/2006 Sano .............................. 333/26
2010/0148891 A1 6/2010 Sano

FOREIGN PATENT DOCUMENTS

JP 2000-077907 3/2000
JP 2010-141644 6/2010

* cited by examiner

*Primary Examiner* — Robert Pascal
*Assistant Examiner* — Kimberly Glenn
(74) *Attorney, Agent, or Firm* — Cozen O'Connor

(57) ABSTRACT

Dielectric waveguide comprising a circular input/output electrode on its bottom surface and surrounded by an exposed dielectric portion thereof around which a conductor film is disposed. A short stub crosses through the exposed dielectric portion to couple the electrode and film together. The printed circuit board has a front surface formed with a generally-circular island-shaped electrode surrounded by a front surface-side ground pattern in a spaced-apart relation thereto, and a back surface formed with a strip line surrounded by a back surface-side ground pattern in spaced-apart relation thereto. An approximate center of the island-shaped electrode and one end of the strip line are coupled together, and the front surface-side ground pattern and the back surface-side pattern are coupled together. The input/output electrode of the dielectric waveguide and the island-shaped electrode of the printed circuit board are coupled together.

4 Claims, 5 Drawing Sheets

INPUT/OUTPUT COUPLING STRUCTURE FOR DIELECTRIC WAVEGUIDE

TECHNICAL FIELD

The present invention relates to an input/output coupling structure between a dielectric waveguide and a printed circuit board on which the dielectric waveguide is to be mounted, and, more particularly, to a bandwidth widening technique for the input/output coupling structure.

BACKGROUND ART

In late years, mobile communications devices have become widespread, and frequency bands up to about 2 GHz band have come to be used in mobile communications. In a base station for communications in such frequency bands, a dielectric waveguide filter has been used which comprises a combination of a plurality of resonators each composed of a dielectric waveguide.

The dielectric waveguide filter is capable of facilitating downsizing and weight reduction based on a wavelength shortening effect of dielectric, and thereby can be directly mounted on a printed circuit board.

However, the dielectric waveguide, and a strip line used in the printed circuit board, are different from each other in terms of a transmission mode of electromagnetic wave. Thus, as a prerequisite to using the dielectric waveguide filter while being directly mounted on the printed circuit board, it is necessary to provide, between the strip line and the dielectric waveguide, an input/output coupling structure for performing mode conversion.

LIST OF PRIOR ART DOCUMENTS

Patent Documents

Patent Document 1: JP 2000-77907A
Patent Document 2: JP 2010-141644A

SUMMARY OF THE INVENTION

Problem To Be Solved By the Invention

FIG. 6(*a*) is an exploded perspective view illustrating one example of a conventional dielectric waveguide input/output coupling structure.

As illustrated in FIG. 6(*a*), a dielectric waveguide 60 comprises a dielectric block composed of a rectangular parallelepiped-shaped dielectric, and a conductor film 62 covering an exterior of the dielectric block, wherein the dielectric waveguide 60 has a bottom surface having an island-shaped input/output electrode 61 made of a conductor and surrounded by an exposed dielectric portion, i.e., an exposed portion of the dielectric. On the other hand, a printed circuit board 70 has a front surface having: a generally-circular island-shaped electrode 71 made of a conductor; and a front surface-side ground pattern 74 made of a conductor and insulated from the island-shaped electrode 71, while surrounding periphery of the island-shaped electrode 71 in spaced-apart relation to the island-shaped electrode 71.

The printed circuit board 70 has a back surface having a strip line 72, wherein the island-shaped electrode 71 and a distal end of the strip line 72 are coupled together via a through-hole 73.

The dielectric waveguide 60 is mounted on the printed circuit board 70 to allow the input/output electrode 61 to be disposed in face-to-face relation to the island-shaped electrode 71.

This dielectric waveguide input/output coupling structure has a problem that a range of an applicable relative bandwidth is narrow.

As a solution for the above problem, a dielectric waveguide input/output coupling structure illustrated in FIG. 6(*b*) has been developed. FIG. 6(*b*) is an exploded perspective view illustrating another example of the conventional dielectric waveguide input/output coupling structure.

As illustrated in FIG. 6(*b*), a dielectric waveguide 80 comprises a dielectric block composed of a rectangular parallelepiped-shaped dielectric, and a conductor film 82 covering an exterior of the dielectric block, wherein the dielectric waveguide 80 has a bottom surface having a generally quadrangular input/output electrode 81 made of a conductor and surrounded by an exposed dielectric portion, i.e., an exposed portion of the dielectric.

On the other hand, a printed circuit board 100 has a front surface having: a strip line 102; a generally-quadrangular island-shaped electrode 101 located at a distal end of the strip line 102; and a front surface-side ground pattern 104 made of a conductor and insulated from the island-shaped electrode 101, while surrounding periphery of the island-shaped electrode 101 in spaced-apart relation to the island-shaped electrode 101.

The dielectric waveguide 80 is mounted on the printed circuit board 100 while interposing therebetween a spacer 90 having an outer surface made of a conductor, to allow the input/output electrode 81 to be disposed in spaced-apart, face-to-face relation to the island-shaped electrode 101.

This dielectric waveguide input/output coupling structure has one problem that the relative bandwidth can be widened only at a frequency of 5 GHz or more, and another problem that downsizing and weight reduction of the input/output coupling structure will be hindered due to an increase in the number of components of the input/output coupling structure, an increase in size of the dielectric waveguide required for electromagnetic coupling, etc., and the input/output coupling structure will become complicated.

It is an object of the present invention to provide a dielectric waveguide input/output coupling structure capable of facilitating aligning of a dielectric waveguide with respect to a printed circuit board, and exhibiting low-loss and wideband characteristics even at a frequency of less than 5 GHz, with a simple configuration.

Means For Solving the Problem

In order to achieve the above object, according to one aspect of the present invention, there is provided a dielectric waveguide input/output coupling structure for coupling an input/output electrode of a dielectric waveguide and a strip line on a printed circuit board together, wherein the dielectric waveguide comprises: a generally circular input/output electrode provided on a bottom surface of the dielectric waveguide and surrounded by an exposed dielectric portion of the dielectric waveguide around which a conductor film is disposed; and a short stub crossing through the exposed dielectric portion to couple the input/output electrode and the conductor film together.

According to another aspect of the present invention, in addition to the above feature, the printed circuit board has a front surface having a generally-circular island-shaped electrode and a front surface-side ground pattern surrounding the island-shaped electrode in spaced-apart relation to the island-shaped electrode, and a back surface having a strip line and a back surface-side ground pattern surrounding the strip line in spaced-apart relation to the strip line, wherein an approximately central portion of the island-shaped electrode and one end of the strip line are coupled together, and the front surface-side ground pattern and the back surface-side ground pattern are coupled together, and wherein the input/output electrode of the dielectric waveguide and the island-shaped electrode of the printed circuit board are coupled together.

Effect of the Invention

The dielectric waveguide input/output coupling structure of the present invention can exhibit wideband and low-loss characteristics without causing an increase in the number of components.

DESCRIPTION OF EMBODIMENTS

Figure 1:
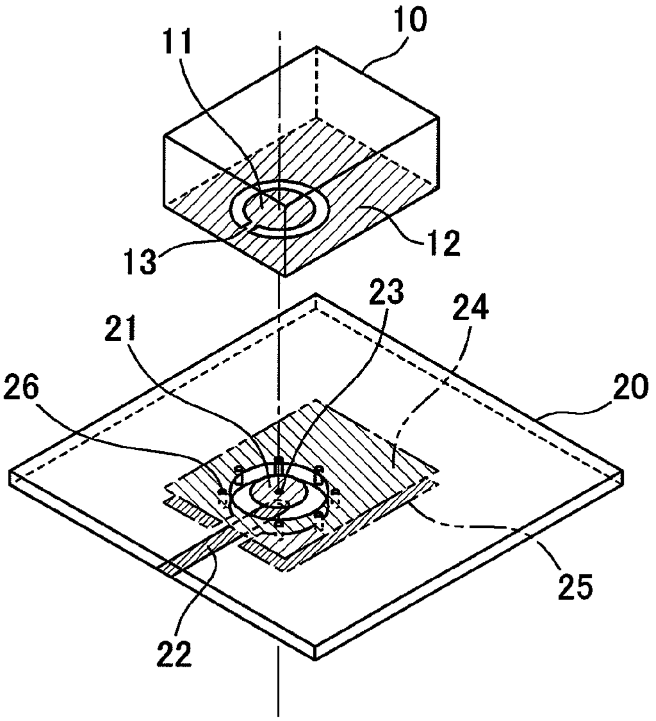
FIG. 1 is an exploded perspective view illustrating a dielectric waveguide input/output coupling structure according to one embodiment of the present invention.
Figure 2A:
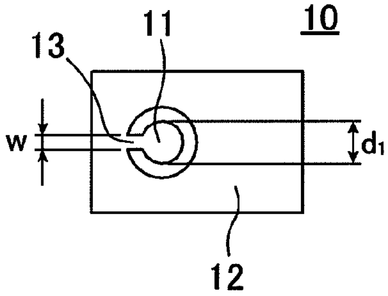
FIGS. 2(*a*) and 2(*b*) are schematic diagrams illustrating opposing surfaces of a dielectric waveguide and a printed circuit board.
Figure 2B:
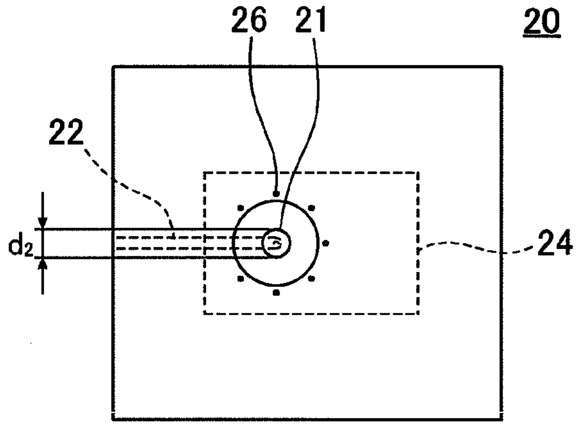
Figure 1:
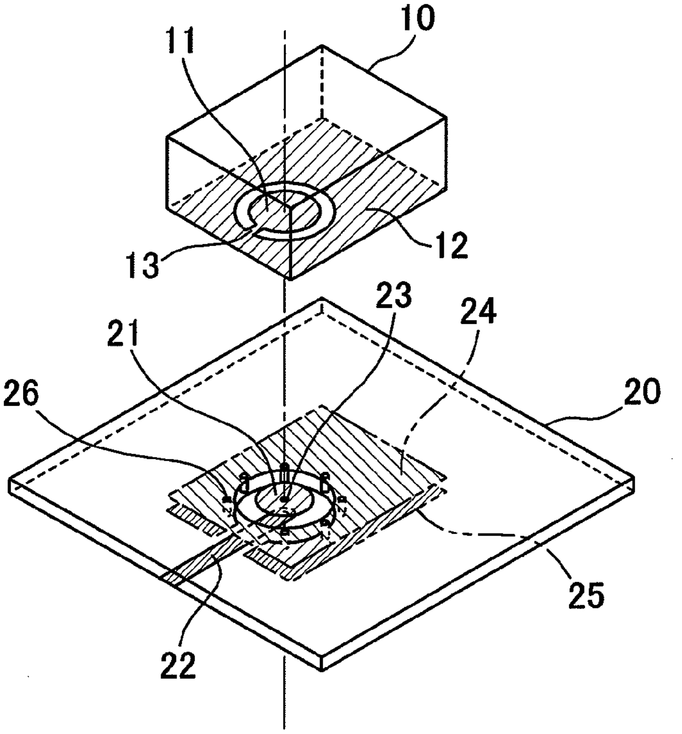
Figure 2A:
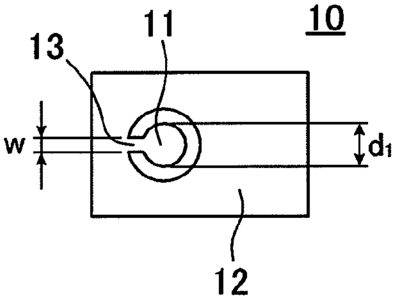
Figure 2B:
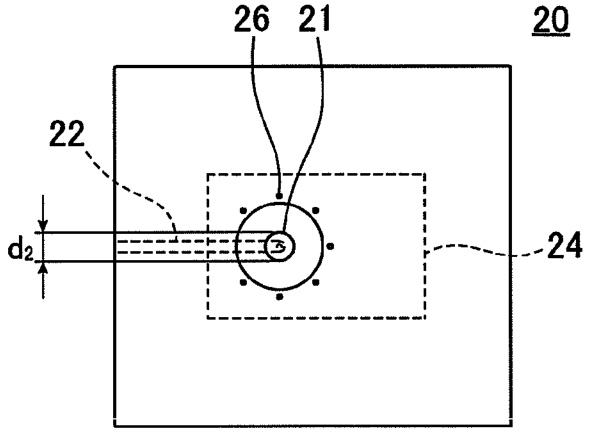

FIG. 1 is an exploded perspective view illustrating a dielectric waveguide input/output coupling structure according to one embodiment of the present invention.

As illustrated in FIG. 1, a dielectric waveguide 10 comprises a dielectric block composed of a rectangular parallelepiped-shaped dielectric, and a conductor film 12 covering an exterior of the dielectric block, wherein the dielectric waveguide 10 has a bottom surface having a generally circular input/output electrode 11 made of a conductor and surrounded by an exposed dielectric portion (i.e., an exposed portion of the dielectric) of the dielectric waveguide 10. The input/output electrode 11 and the conductor film 12 are coupled together via a short (short-circuiting) stub 13 made of a conductor and formed to cross through the exposed dielectric portion.

On the other hand, a printed circuit board 20 has a front surface having: a generally-circular island-shaped electrode 21 made of a conductor; and a front surface-side ground pattern 24 made of a conductor and insulated from the island-shaped electrode 21, while surrounding periphery of the island-shaped electrode 21 in spaced-apart relation to the island-shaped electrode 21.

The printed circuit board 20 has a back surface having: a strip line 22 for connection to an external circuit; and a back surface-side ground pattern 25 made of a conductor and formed to surround the strip line 22 in spaced-apart relation to the strip line 22.

The island-shaped electrode 21 and the strip line 22 are coupled together via a through-hole 23 provided at an approximately central portion of the island-shaped electrode 21, and the front surface-side ground pattern 24 and the back surface-side ground pattern 25 are coupled together via a through-hole group 26 consisting of a plurality of through-holes provided to surround periphery of the island-shaped electrode 21.

The dielectric waveguide 10 is disposed on the printed circuit board 20 to allow the input/output electrode 11 and the island-shaped electrode 21 to be coupled together.

FIGS. 2(*a*) and 2(*b*) are schematic diagrams illustrating the input/output electrode of the dielectric waveguide and the island-shaped electrode of the printed circuit board in FIG. 1, wherein FIG. 2(*a*) is a bottom view of the dielectric waveguide, and FIG. 2(*b*) is a top view of the printed circuit board.

As illustrated in FIG. 2(*a*), the input/output electrode 11 has a diameter $d_1$, and the short stub 13 crossing through the exposed dielectric portion to couple the input/output electrode 11 and the conductor film 12 together has a width w. The width w of the short stub 13 crossing through the exposed dielectric portion is set to be less than the diameter $d_1$.

As illustrated in FIG. 2(*b*), the island-shaped electrode 21 has a diameter $d_2$.

The diameter $d_2$ of the island-shaped electrode 21 is set to be less than the diameter $d_1$ of the input/output electrode 11, so that a required level of mounting position accuracy can be lowered to facilitate aligning of the dielectric waveguide.

Figure 3:
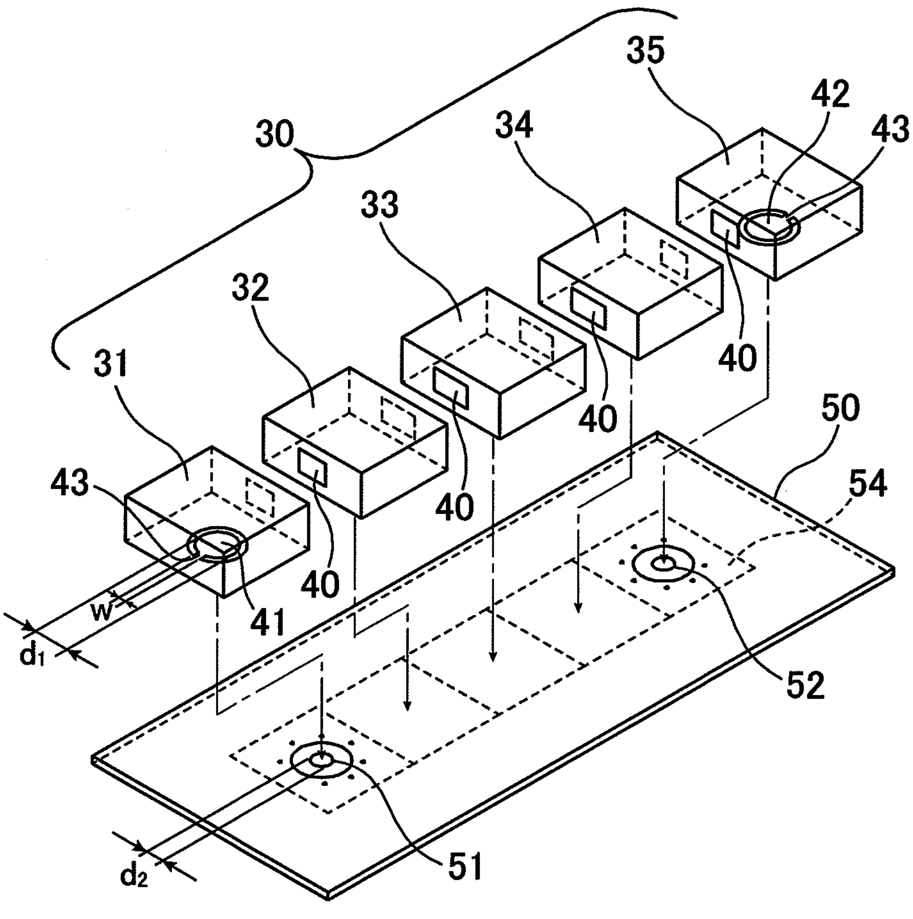
FIG. 3 is an exploded perspective view illustrating one example of a dielectric waveguide filter using a dielectric waveguide input/output coupling structure according to the present invention.

FIG. 3 illustrates one example of a dielectric waveguide filter using a dielectric waveguide input/output coupling structure according to the present invention.

A dielectric waveguide filter 30 is a 5-stage filter using five dielectric waveguide resonators. Each of the five dielectric waveguide resonators is composed of a rectangular parallelepiped-shaped dielectric waveguide (31 to 35) comprising a dielectric block and a conductor film covering the dielectric block.

The dielectric waveguides 31 to 35 are arranged side-by-side in a line, and adjacent ones of the dielectric waveguides 31 to 35 are coupled together via coupling windows 40 each provided on a respective one of opposed side surfaces thereof to expose a portion of a dielectric thereof. Each of the two dielectric waveguides 31, 35 located at opposite ends of the dielectric waveguide filter 30 has a bottom surface having a generally circular input/output electrode (41, 42) made of a conductor and surrounded by an exposed dielectric portion thereof, wherein the input/output electrode (41, 42) and the conductor film are coupled together via a short stub (43, 43).

On the other hand, a printed circuit board 50 has a front surface having: two generally-circular island-shaped electrodes 51, 52; and two front surface-side ground patterns 54 surrounding periphery of respective ones of the island-shaped electrodes 51, 52. Each of the island-shaped electrodes 51, 52 is insulated from a corresponding one of the front surface-side ground patterns 54.

The printed circuit board 50 has a back surface having non-illustrated two strip lines, and non-illustrated two back surface-side ground patterns surrounding periphery of respective ones of the strip lines. Each of the strip lines is insulated from a corresponding one of the back surface-side ground patterns.

The dielectric waveguide filter 30 is disposed on the printed circuit board 50 to allow the input/output electrode 41 and the island-shaped electrode 51 to be coupled together and allow the input/output electrode 42 and the island-shaped electrode 52 to be coupled together.

Figure 4:
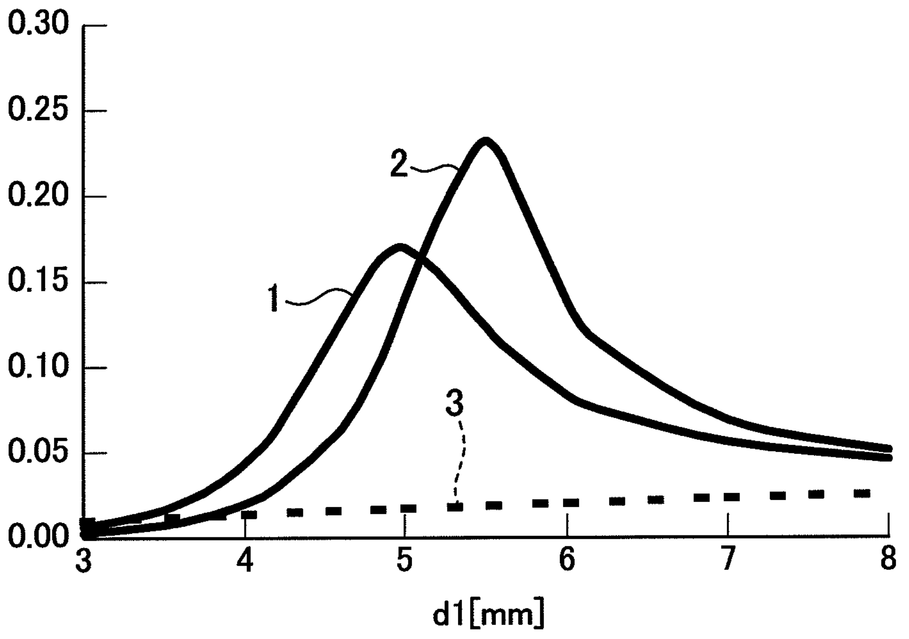
FIG. 4 is a graph illustrating a relative bandwidth in the dielectric waveguide filter in FIG. 3.

FIG. 4 is a graph illustrating a relative bandwidth measured when the width w of the short stub and the diameter $d_1$ of the input/output electrode are changed in the dielectric waveguide filter using the dielectric waveguide input/output coupling structure according to the present invention as illustrated in FIG. 3.

In FIG. 4, the horizontal axis represents the diameter $d_1$ [mm] of the input/output electrode, and the vertical axis represents the relative bandwidth. The characteristic curve 2 and the characteristic curve 1 were obtained when the width w of the short stub is set, respectively, to 2.0 [mm] and 1.0 [mm], and the characteristic curve 3 was obtained in a dielectric waveguide filter devoid of the short stub.

The relative bandwidth was calculated under the following conditions: a center frequency f=2.6 [GHz]; a return loss RL=20 [dB]; and the number n of dielectric waveguide resonators=5.

Figure 5:
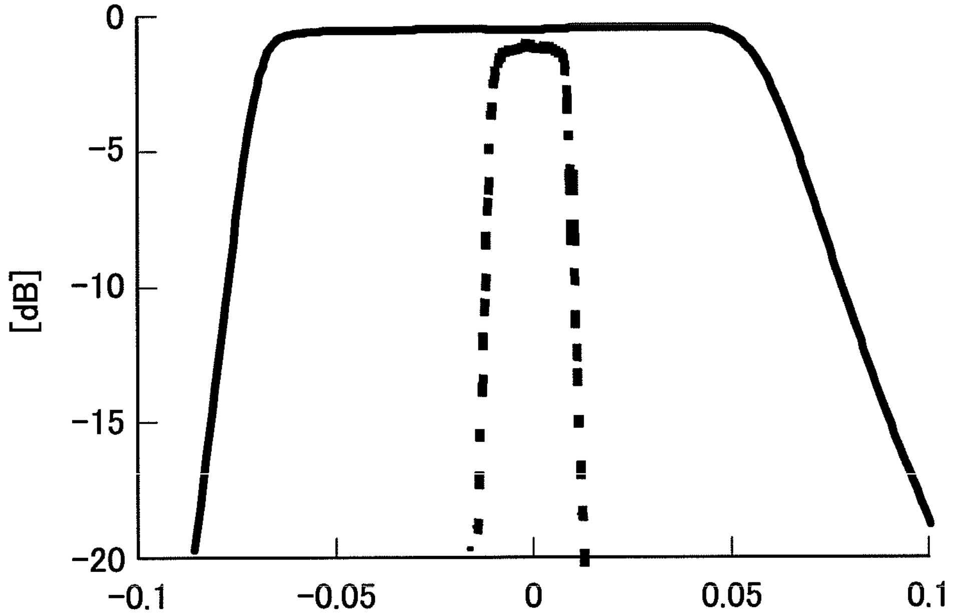
FIG. 5 is a graph illustrating a transmission characteristic of the dielectric waveguide filter in FIG. 3.
Figure 6B:
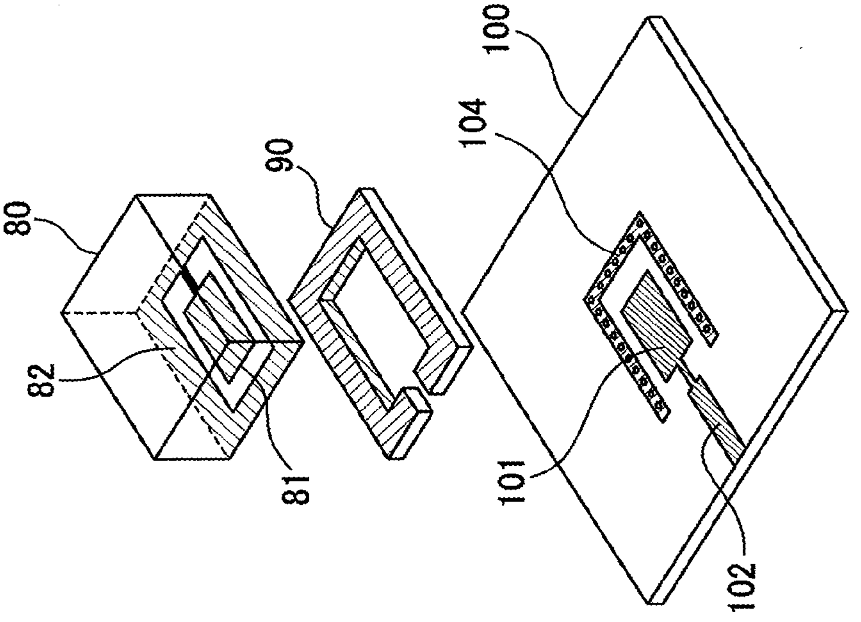
PRIOR ART FIG.6b
FIGS. 6(*a*) and 6(*b*) are exploded perspective views illustrating some examples of a conventional dielectric waveguide input/output coupling structure.
Figure 6A:
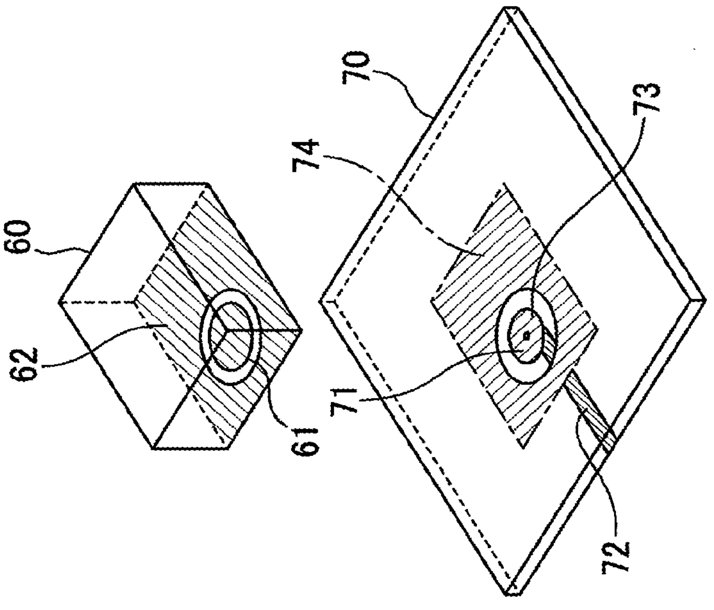
PRIOR ART FIG.6a

FIG. 5 is a graph illustrating a transmission characteristic of the dielectric waveguide filter mounted on the printed circuit board 50 as illustrated in FIG. 3, under the following conditions: the center frequency f=2.6 [GHz]; the width w of the short stub=1.0 [mm]; and the diameter $d_1$ of the input/output electrode=4.6 [mm]. In FIG. 5, the horizontal axis represents the relative bandwidth, and the vertical axis represents the transmission characteristic [dB], wherein the solid line indicates a transmission characteristic curve obtained in the dielectric waveguide filter using the dielectric waveguide input/output coupling structure according to the present invention, and the dotted line indicates a transmission characteristic curve obtained in a comparative dielectric waveguide filter devoid of the short stub.

The results in FIGS. 4 and 5 show that a bandwidth of the transmission characteristic can be widened by providing the short stub and setting each of the width of the short stub and the diameter of the input/output electrode to a desired value.

As described above, the dielectric waveguide input/output coupling structure of the present invention can be used to facilitate aligning and coupling between the input/output electrode of the dielectric waveguide and the island-shaped electrode of the printed circuit board, and minimize adverse effects on characteristics even if some degree of misalignment occurs, without causing an increase in the number of components. Thus, it becomes possible to provide a dielectric waveguide input/output coupling structure capable of facilitating aligning and coupling between the dielectric waveguide and the printed circuit board, and exhibiting wideband and low-loss characteristics, with a simple configuration.

In the above embodiment, the through-hole group 26 provided around the island-shaped electrode 21 can suppress unwanted radiation of electromagnetic wave in an input/output coupling region, and enhance isolation between adjacent input/output coupling regions, to provide further enhanced efficiency of the input/output coupling structure.

In cases where the printed circuit board 20 is a multilayer board having a plurality of wiring layers, the strip line 22 may be provided on an inner layer. Further, the short stub may be formed at any suitable position. The strip line 22 is not indispensable. For example, the strip line 22 may be omitted by providing a connector directly on the back surface of the printed circuit board, and directly coupling the connector to the through-hole.

REFERENCE NUMERALS

10, 31 to 35, 60, 80: dielectric waveguide
20, 50, 70, 100: printed circuit board
30: dielectric waveguide
40: coupling window
90: spacer
11, 41, 42, 61, 81: input/output electrode
12, 62, 82: conductor film
13, 43: short stub
21, 51, 52, 71, 101: island-shaped electrode
22, 72, 102: strip line
23, 73: through-hole
24, 54, 74, 104: front surface-side ground pattern
25: back surface-side ground pattern
26: through-hole group

What is claimed is:

1. A dielectric waveguide input/output coupling structure for coupling an input/output electrode of a dielectric waveguide and a strip line on a printed circuit board together, wherein the dielectric waveguide comprises:

a generally circular input/output electrode provided on a bottom surface of the dielectric waveguide and surrounded by an exposed dielectric portion of the dielectric waveguide around which a conductor film is disposed; and a short stub crossing through the exposed dielectric portion to couple the input/output electrode and the conductor film together, wherein the short sub crossing through the exposed dielectric portion has a width less than a diameter of the input/output electrode.

2. A dielectric waveguide input/output coupling structure for coupling an input/output electrode of a dielectric waveguide and a strip line on a printed circuit board together, wherein:

the dielectric waveguide comprises a generally circular input/output electrode provided on a bottom surface of the dielectric waveguide and surrounded by an exposed dielectric portion of the dielectric waveguide around which a conductor film is disposed, and a short stub crossing through the exposed dielectric portion to couple the input/output electrode and the conductor film together; and the printed circuit board has a front surface having a generally-circular island-shaped electrode and a front surface-side ground pattern surrounding the island-shaped electrode spaced apart therefrom, and a back surface having a strip line and a back surface-side ground pattern surrounding the strip line spaced apart therefrom, wherein approximate center of the island-shaped electrode and one end of the strip line are coupled together, and the front surface-side ground pattern and the back surface-side ground pattern are coupled together, and wherein the dielectric waveguide and the printed circuit board are arranged such that the input/output electrode of the dielectric waveguide and the island-shaped electrode of the printed circuit board are coupled together.

3. The dielectric waveguide input/output coupling structure as defined in claim 2, wherein the front surface-side ground pattern and the back surface-side ground pattern are coupled together via a plurality of through-holes arranged to surround periphery of the island-shaped electrode.

4. The dielectric waveguide input/output coupling structure as defined in claim 2, wherein the short stub crossing through the exposed dielectric portion has a width less than a diameter of the input/output electrode.

* * * * *